United States Patent
Zhao et al.

(10) Patent No.: US 10,192,930 B2
(45) Date of Patent: Jan. 29, 2019

(54) THREE DIMENSIONAL COMPLEMENTARY METAL OXIDE SEMICONDUCTOR CARBON NANOTUBE THIN FILM TRANSISTOR CIRCUIT

(71) Applicants: Tsinghua University, Beijing (CN); HON HAI PRECISION INDUSTRY CO., LTD., New Taipei (TW)

(72) Inventors: Yu-Dan Zhao, Beijing (CN); Qun-Qing Li, Beijing (CN); Xiao-Yang Xiao, Beijing (CN); Guan-Hong Li, Beijing (CN); Yuan-Hao Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/927,293

(22) Filed: Mar. 21, 2018

(65) Prior Publication Data
US 2018/0219044 A1    Aug. 2, 2018

Related U.S. Application Data

(63) Continuation of application No. 15/145,730, filed on May 3, 2016, now Pat. No. 9,966,416.

(51) Int. Cl.
*H01L 27/28* (2006.01)
*H01L 51/05* (2006.01)
(Continued)

(52) U.S. Cl.
CPC .......... *H01L 27/283* (2013.01); *H01L 27/281* (2013.01); *H01L 51/0003* (2013.01);
(Continued)

(58) Field of Classification Search
CPC . H01L 27/283; H01L 51/0003; H01L 27/281; H01L 51/0097; H01L 51/0545;
(Continued)

(56) References Cited

U.S. PATENT DOCUMENTS

| | | | |
|---|---|---|---|
| 8,125,824 B1* | 2/2012 | Ward | G11C 13/025 365/134 |
| 2010/0022082 A1* | 1/2010 | Louis | B82Y 10/00 438/618 |

(Continued)

*Primary Examiner* — Latanya N Crawford
(74) *Attorney, Agent, or Firm* — ScienBiziP, P.C.

(57) ABSTRACT

A metal oxide semiconductor carbon nanotube thin film transistor circuit includes a p-type carbon nanotube thin film transistor and an n-type carbon nanotube thin film transistor stacked on one another. The p-type carbon nanotube thin film transistor includes a first semiconductor carbon nanotube layer, a first drain electrode, a first source electrode, a functional dielectric layer, and a first gate electrode. The n-type carbon nanotube thin film transistor includes a second semiconductor carbon nanotube layer, a second drain electrode, a second source electrode, a first insulating layer, and a second gate electrode. The first drain electrode and the second drain electrode are electrically connected with each other. The first gate electrode and the second gate electrode are electrically connected with each other.

19 Claims, 18 Drawing Sheets

(51) Int. Cl.
    *H01L 51/00*     (2006.01)
    *H01L 51/10*     (2006.01)

(52) U.S. Cl.
    CPC ...... *H01L 51/0048* (2013.01); *H01L 51/0097* (2013.01); *H01L 51/0541* (2013.01); *H01L 51/0545* (2013.01); *H01L 51/055* (2013.01); *H01L 51/0512* (2013.01); *H01L 51/105* (2013.01); *H01L 2251/301* (2013.01); *H01L 2251/303* (2013.01)

(58) Field of Classification Search
    CPC ............. H01L 51/0541; H01L 51/0048; H01L 2251/303; H01L 2251/301; H01L 51/105; H01L 51/055
    See application file for complete search history.

(56) References Cited

U.S. PATENT DOCUMENTS

| | | | |
|---|---|---|---|
| 2013/0181189 A1* | 7/2013 | Bertin | B82Y 10/00 257/29 |
| 2016/0190495 A1* | 6/2016 | Li | H01L 51/107 257/29 |
| 2016/0373256 A1* | 12/2016 | Han | H01L 27/283 |

* cited by examiner

THREE DIMENSIONAL COMPLEMENTARY METAL OXIDE SEMICONDUCTOR CARBON NANOTUBE THIN FILM TRANSISTOR CIRCUIT

This application is a continuation application of U.S. patent application Ser. No. 15/145730, filed on May 3, 2016, entitled "three dimensional complementary metal oxide semiconductor carbon nanotube thin film transistor circuit."

BACKGROUND

1. Technical Field

The present invention relates to thin film transistor semiconductor device based on carbon nanotubes and method for making the same.

2. Description of Related Art

Single-walled carbon nanotubes (SWCNTs) are promising candidates for future electronic devices because of their excellent electrical and mechanical properties, including high mobility, large current density, and extremely good mechanical strength. In particular, because of their uniformity and repeatability, thin film transistors (TFTs) with SWCNT random networks as conductive channels have been widely studied. Meanwhile, depositing or printing pre-separated semiconducting SWCNTs or transferring networks grown by chemical vapor deposition onto flexible substrates can meet the needs of flexible and wearable electronic devices.

SWCNT-TFTs show p-type characteristics in ambient conditions because of the adsorption of oxygen and water vapor. Although many applications, such as logic circuits, memory devices, sensors, or even computers, are fabricated by p-type TFTs, complementary metal oxide semiconductor (CMOS) circuits including a couple of n-type and p-type TFTs are still demanded urgently because of their low static power consumption and large noise margin. To date, several methods have been investigated to achieve high performance n-type SWCNT-TFTs, but most of them have difficulties in integration with p-type devices. For example, doping SWCNT channels with alkali metal such as potassium (K), or organic polymers such as Polyetherimide (PEI) and viologen can lead to high-performance n-type TFTs. However, alkali metal and organic polymers are unstable and flowable, which may contaminate the nearby exposed p-type TFTs, which means that sparse integration is required. Another approach is covering high-κ oxide such as hafnium oxide using atomic layer deposition (ALD) or passivation with a silicon nitride film using plasma-enhanced chemical vapor deposition (PECVD) as the dielectric layer to isolate oxygen and water, as well as electron doping. However, the covering materials are all compact and grown at a relatively high temperature beyond the photoresist endurance, the positions of the dopant have to be defined using a relatively large size shadow mask instead of standard photolithography, leading to jumbo size devices as a result.

What is needed, therefore, is a method of integrating n-type and p-type TFTs compactly, massively, and stably that can overcome the above-described shortcomings.

BRIEF DESCRIPTION OF THE DRAWINGS

Many aspects of the exemplary embodiments can be better understood with references to the following drawings. The components in the drawings are not necessarily drawn to scale, the emphasis instead being placed upon clearly illustrating the principles of the exemplary embodiments. Moreover, in the drawings, like reference numerals designate corresponding parts throughout the several views.

DETAILED DESCRIPTION

Figure 1:
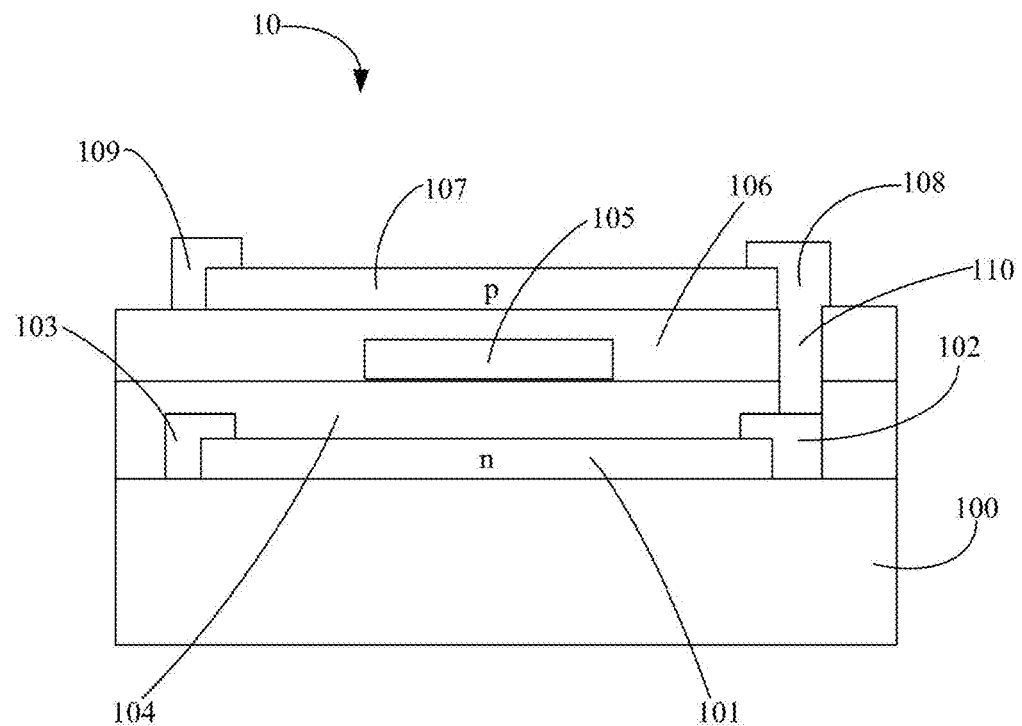
FIG. 1 shows a cross-section schematic view of one exemplary embodiment of a three dimensional complementary metal oxide semiconductor carbon nanotube thin film transistor (3D CMOS CNT-TFT) circuit in accordance to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" exemplary embodiment in this disclosure are not necessarily to the same exemplary embodiment, and such references mean at least one.

Referring to FIG. 1, one exemplary embodiment of a 3D CMOS CNT-TFT circuit 10 comprises an insulating substrate 100, a first semiconductor carbon nanotube layer 101, a first drain electrode 102, a first source electrode 103, a functional dielectric layer 104, a first gate electrode 105, a first insulating layer 106, a second semiconductor carbon nanotube layer 107, a second drain electrode 108, and a second source electrode 109.

The first semiconductor carbon nanotube layer 101 is on the insulating substrate 100. The first drain electrode 102 and the first source electrode 103 are separated from each other, and electrically connected to the first semiconductor carbon nanotube layer 101. The functional dielectric layer 104 is on and cover the first semiconductor carbon nanotube layer 101, the first drain electrode 102 and the first source electrode 103. The first gate electrode 105 is on the functional dielectric layer 104, and insulated from the first semiconductor carbon nanotube layer 101, the first source electrode 103, and the first drain electrode 102. The first insulating layer 106 is on and cover the first gate electrode 105 and the functional dielectric layer 104. The second semiconductor carbon nanotube layer 107 is on the first insulating layer 106. The second drain electrode 108 and the second source electrode 109 are separated from each other, and electrically connected to the second semiconductor carbon nanotube layer 107. At least the portion of the second semiconductor carbon nanotube layer 107 that is between the second drain electrode 108 and the second source electrode 109 is exposed and not covered.

The first semiconductor carbon nanotube layer 101 is an n-type semiconductor layer. Thus, the first semiconductor carbon nanotube layer 101, the first drain electrode 102, the first source electrode 103, the functional dielectric layer 104, and the first gate electrode 105 form an n-type TFT. The n-type TFT is a top gate type TFT. The first gate electrode 105 is p-type electrode. Thus, the first gate electrode 105, the first insulating layer 106, the second semiconductor carbon nanotube layer 107, the second drain electrode 108, and the second source electrode 109 form a p-type TFT. The p-type TFT is a back gate type TFT. The n-type TFT and the p-type TFT are stacked on one another and share the first gate electrode 105 as a common gate electrode. The first drain electrode 102 and the second drain electrode 108 are electrically connected with each other.

The insulating substrate 100 supports different elements on the insulating substrate 100. A material of the insulating substrate 100 can be hard material or flexible material. The hard material can be as glass, quartz, ceramics, or diamond. The flexible material can be polymer such as polyethylene terephthalate, polyethylene naphthalate, polyethylene terephthalate, or polyimide (PI). In one exemplary embodiment, the insulating substrate 100 is a polyimide film.

The first semiconductor carbon nanotube layer 101 is on a surface of the insulating substrate 100. The first semiconductor carbon nanotube layer 101 comprises a plurality of carbon nanotubes. The first semiconductor carbon nanotube layer 101 has semi-conductive property. The first semiconductor carbon nanotube layer 101 can consist of a plurality of semi-conductive carbon nanotubes. In one exemplary embodiment, a few metallic carbon nanotubes can be in the first semiconductor carbon nanotube layer 101, but the metallic carbon nanotubes cannot affect the semi-conductive property of the first semiconductor carbon nanotube layer 101.

The plurality of carbon nanotubes are connected to each other to form a conductive network. The carbon nanotubes of the first semiconductor carbon nanotube layer 101 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one exemplary embodiment, the carbon nanotubes in the first semiconductor carbon nanotube layer 101 are arranged to extend along the direction substantially parallel to the surface of the carbon nanotube layer. In one exemplary embodiment, all the carbon nanotubes in the first semiconductor carbon nanotube layer 101 are arranged to extend along the same direction. In another exemplary embodiment, some of the carbon nanotubes in the carbon nanotube layer are arranged to extend along a first direction, and some of the carbon nanotubes in the first semiconductor carbon nanotube layer 101 are arranged to extend along a second direction, perpendicular to the first direction.

In one exemplary embodiment, the first semiconductor carbon nanotube layer 101 is a free-standing structure and can be drawn from a carbon nanotube array. The term "free-standing structure" means that the first semiconductor carbon nanotube layer 101 can sustain the weight of itself when it is hoisted by a portion thereof without any significant damage to its structural integrity. Thus, the first semiconductor carbon nanotube layer 101 can be suspended by two spaced supports. The free-standing first semiconductor carbon nanotube layer 101 can be laid on the insulating substrate 100 directly and easily.

The first semiconductor carbon nanotube layer 101 can be a substantially pure structure of the carbon nanotubes, with few impurities and chemical functional groups. The first semiconductor carbon nanotube layer 101 can also be composed of a combination of semi-conductive and metallic carbon nanotubes obtained via chemical vapor deposition. The ratio between the semi-conductive and the metallic carbon nanotubes is 2:1, and the percentage of the semiconductive carbon nanotubes is about 66.7% in the combination. In one exemplary embodiment, all of the metallic carbon nanotubes can be completely removed via chemical separation method. In another exemplary embodiment, most of the metallic carbon nanotubes are removed, and there are a few metallic carbon nanotubes left. Furthermore, the percentage of the semi-conductive carbon nanotubes in the first semiconductor carbon nanotube layer 101 ranges from about 90% to about 100%. In one exemplary embodiment, the first semiconductor carbon nanotube layer 101 consists of a plurality of single-walled carbon nanotubes. The plurality of single-walled carbon nanotubes are parallel with each other. A diameter of the carbon nanotube is smaller than 2 nanometers. A thickness of the first semiconductor carbon nanotube layer 101 ranges from about 0.5 nanometers to about 2 nanometers. A length of the carbon nanotube ranges from about 2 micrometers to about 4 micrometers. In one exemplary embodiment, a diameter of the carbon nanotube is greater than 0.9 nanometers and smaller than 1.4 nanometers.

The functional dielectric layer 104 is configured to convert the p-type semiconductor carbon nanotube to n-type by semiconductor carbon nanotube and by doping the first semiconductor carbon nanotube layer 101. The functional dielectric layer 104 can also be used to insulate the first gate electrode 105 from the first semiconductor carbon nanotube layer 101, the first source electrode 103, and the first drain electrode 102. Furthermore, the functional dielectric layer 104 is insulating and can prevent the first semiconductor carbon nanotube layer 101 from absorbing oxygen gas and water vapour. The material of the functional dielectric layer 104 can be hafnium oxide ($HfO_2$), yttrium oxide ($Y_2O_3$), aluminum oxide ($Al_2O_3$), silicon nitride ($Si_3N_4$), magnesium oxide (MgO), potassium, or organic polymers such as PEI. A thickness of the functional dielectric layer 104 can range from about 20 nanometers to about 200 nanometers. In one exemplary embodiment, the thickness of the functional dielectric layer 104 ranges from about 25 nanometers to about 30 nanometers. The functional dielectric layer 104 covers at least 80% of the surface of the first semiconductor carbon nanotube layer 101. The functional dielectric layer 104 can cover the entire surface of the first semiconductor carbon nanotube layer 101. Furthermore, the first semiconductor carbon nanotube layer 101 can be sealed by the functional dielectric layer 104 and the insulating substrate 100. Thus, the first semiconductor carbon nanotube layer 101 can be completely isolated from air and moisture. The functional dielectric layer 104 can be a single layer structure or multi-layer structure. In one exemplary embodiment, the functional dielectric layer 104 is a $Si_3N_4$ layer with a thickness of about 50 nanometers. In another exemplary embodiment, the functional dielectric layer 104 includes a MgO layer and an $Al_2O_3$ layer. The MgO layer is in direct contact with the first semiconductor carbon nanotube layer 101. The MgO layer is configured to modulate the first semiconductor carbon nanotube layer 101, reduce water molecules and holes attached on the first semiconductor carbon nanotube layer 101. A thickness of the MgO layer can range from about 10 nanometer to about 50 nanometers. A thickness of the $Al_2O_3$ layer can range from about 20 nanometer to about 40 nanometers. The $Al_2O_3$ layer itself cannot convert the p-type semiconductor carbon nanotube to n-type by semiconductor carbon nanotube, but can convert the p-type semiconductor carbon nanotube to n-type by semiconductor carbon nanotube under the effect of the MgO.

The material of the first drain electrode 102 and the first source electrode 103 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one exemplary embodiment, the material of the first drain electrode 102 and the first source electrode 103 can comprise Au and Ti. The thickness of the Ti is about 2 nanometers, and the thickness of the Au is about 50 nanometers. In one exemplary embodiment, the first drain electrode 102 and the first source electrode 103 are on opposite edges of and electrically connected to the first semiconductor carbon nanotube layer 101.

The first gate electrode 105 is on a surface of the functional dielectric layer 104 and insulated from the first semiconductor carbon nanotube layer 101. Furthermore, the length of the first gate electrode 105 can be smaller than the length of the portion of the first semiconductor carbon nanotube layer 101 that is between the first drain electrode 102 and the first source electrode 103. The material of the first gate electrode 105 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one exemplary embodiment, the material of the first gate electrode 105 comprises Au and Ti. The thickness of the Ti is about 2 nanometers, and the thickness of the Au is about 50 nanometers.

The first insulating layer 106 is configured to insulate the first gate electrode 105 from the second semiconductor carbon nanotube layer 107, the second drain electrode 108, and the second source electrode 109. The material of the insulating layer 106 cannot convert the type of the second semiconductor carbon nanotube layer 107. The material of the insulating layer 106 can be metal oxide or polymer. In one exemplary embodiment, the insulating layer 106 is a $Al_2O_3$ layer with a thickness of about 30 nanometers.

The second semiconductor carbon nanotube layer 107 is similar to the first semiconductor carbon nanotube layer 101, except that the first semiconductor carbon nanotube layer 101 is converted to n-type and the second semiconductor carbon nanotube layer 107 is kept as a p-type semiconductor carbon nanotube layer. The material and structure of the second drain electrode 108 and the second source electrode 109 can be the same as that of the first drain electrode 102 and the first source electrode 103. A through hole 110 is defined by the functional dielectric layer 104 and the first insulating layer 106 to expose the first drain electrode 102. Part of the second drain electrode 108 extends through the through hole 110 to be in direct contact with the first drain electrode 102.

Figure 2:
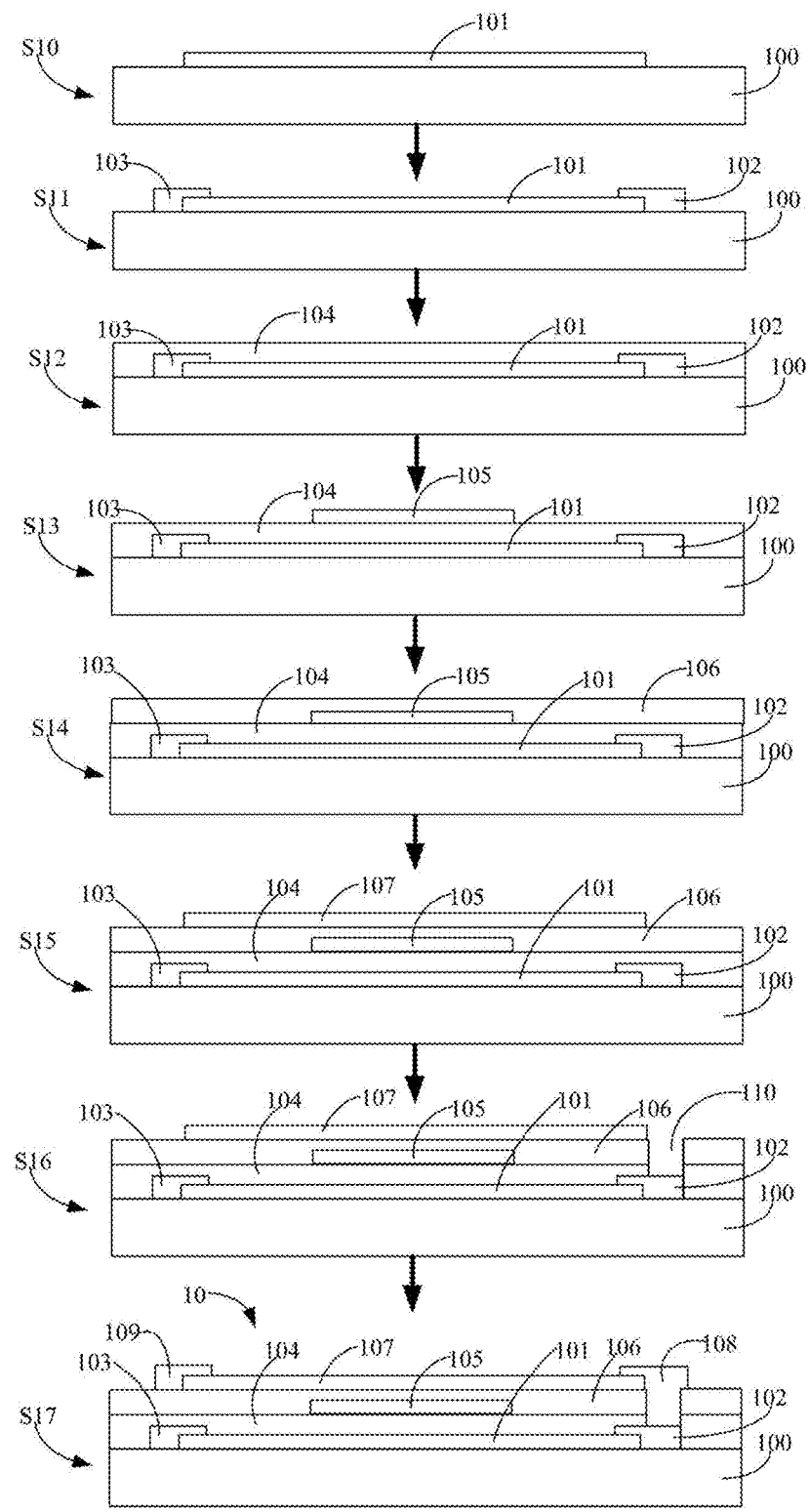
FIG. 2 is a flow chart of one exemplary embodiment of a method of making the 3D CMOS CNT-TFT circuit of FIG. 1.

Referring to FIG. 2, one exemplary embodiment of a method of making the 3D CMOS CNT-TFT circuit 10 above comprises:

step (S10), forming a first semiconductor carbon nanotube layer 101 on an insulating substrate 100;

step (S11), applying a first drain electrode 102 and a first source electrode 103 to be electrically connected to the first semiconductor carbon nanotube layer 101;

step (S12), depositing a functional dielectric layer 104 on a surface of the first semiconductor carbon nanotube layer 101;

step (S13), applying a first gate electrode 105 on the functional dielectric layer 104, the first gate electrode 105 is insulated from the first semiconductor carbon nanotube layer 101;

step (S14), depositing a first insulating layer 106 to cover the first semiconductor carbon nanotube layer 101, the first drain electrode 102, the first source electrode 103 and the first gate electrode 105;

step (S15), forming a second semiconductor carbon nanotube 107 on the first insulating layer 106, the second semiconductor carbon nanotube 107 is insulated from the first gate electrode 105;

step (S16), exposing part of the first drain electrode 102 by making a through hole 110 at least on the first insulating layer 106; and step (S17), applying a second drain electrode 108 and a second source electrode 109 to be electrically connected to the second semiconductor carbon nanotube layer 107, the second drain electrode 108 extends into the through hole 110 and is in electrically connected to the first drain electrode 102.

In step (S10), the first semiconductor carbon nanotube layer 101 can be formed on the insulating substrate 100 by:

step (S101), providing a plurality of semiconductor carbon nanotube particles;

step (S102), obtaining a carbon nanotube suspension by mixing the plurality of semiconductor carbon nanotube particles with a solvent; and step (S103), forming the first semiconductor carbon nanotube layer 101 by applying the carbon nanotube suspension on the insulating substrate 100.

In step (S101), the plurality of semiconductor carbon nanotube particles can be mixed single-walled carbon nanotubes obtained through arc discharge methods. Furthermore, the metallic carbon nanotubes can be removed from the mixed single-walled carbon nanotubes to obtain pure semiconductor single-walled carbon nanotubes. In one exemplary embodiment, the percentage of the semiconductor single-walled carbon nanotubes in the plurality of semiconductor carbon nanotube particles is greater than 66.7%. In another exemplary embodiment, the percentage of the semiconductive carbon nanotubes in the plurality of semiconductor carbon nanotube particles is about 98%.

In step (S102), the carbon nanotube suspension can be obtained through stirring methods or ultrasonic dispersion methods. The plurality of semiconductor carbon nanotube particles are uniformly dispersed in the carbon nanotube suspension. The plurality of semiconductor carbon nanotube particles are dispersed into the solvent and ultrasonicated. The ultrasonic time can range from about 30 minutes to about 3 hours. The ultrasonic power can range from about 300 W to about 600 W. The solvent can be water, ethanol, N-methylpyrrolidone (NMP), acetone, chloroform, or tetrahydrofuran, etc. The solvent has polar groups such hydroxy group or carboxyl group, thus the solvent exhibits a strong polarity, and has a large dielectric constant. The plurality of semiconductor carbon nanotube particles can form the conductive network after mixing process. In one exemplary embodiment, the semiconductor carbon nanotube particles are uniformly dispersed in NMP via ultrasonic method. A ratio between a weight of the plurality of semiconductor carbon nanotube particles and volume of the NMP is about 1 mg:30 ml.

In step (S103), applying the carbon nanotube suspension on the insulating substrate 100 includes:

step (S1031), locating the insulating substrate 100 at a bottom of a container;

step (S1032), pouring the carbon nanotube suspension into the container; and step (S1033), keeping the container being static for a certain time.

In step (S1033), the plurality of carbon nanotubes is deposited on the insulating substrate 100 under weight force and attractive force. Furthermore, while the first semiconductor carbon nanotube layer 101 is a free-standing structure, the first semiconductor carbon nanotube layer 101 can be directly laid on the insulating substrate 100. Furthermore, the semiconductor layer 120 can comprise a plurality of wires or a carbon nanotube film. The carbon nanotube film comprises a plurality of carbon nanotubes joined end to end by van der Waals force. The carbon nanotube wire can be obtained by treating the carbon nanotube film with an organic solution. The carbon nanotube film will be shrunk into the carbon nanotube wire.

Furthermore, a step of treating the insulating substrate 100 to form a polar surface can be performed before step (S10). The polar groups can attract the plurality of carbon nanotubes in the first semiconductor carbon nanotube layer 101.

In one exemplary embodiment, the insulating substrate 100 is treated by:

step (S104), hydrophilic treating the insulating substrate 100 via ion etching; and step (S105), functionalizing the insulating substrate 100 with an organic solution to introduce polar groups on the insulating substrate 100. The surface of the insulating substrate 100 comprises the plurality of polar groups.

In step (S105), the organic solution can be aminopropyl triethoxysilane (APTES) solution, or polylysine (poly-L-lysine) solution. Furthermore, other solution with polar group can be applied. In one exemplary embodiment, the organic solution is APTES. The insulating substrate 100 can be firmly adjoined to the APTES. The amino group in the APTES can be firmly adjoined to the MgO layer. Thus, the MgO layer can be quickly and firmly attached onto the insulating substrate 100. Furthermore, the particles in the dielectric layer can also be tightly attached on the insulating substrate 100. Thus, stability of the N-type TFT can be improved.

In step (S11), the first drain electrode 102 and the first source electrode 103 can be formed via evaporating, sputtering, or printing. In one exemplary embodiment, the first source electrode 103 is formed on the first semiconductor carbon nanotube layer 101 via evaporating. The material of the first drain electrode 102 and the first source electrode 103 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one exemplary embodiment, the material of the first drain electrode 102 and the first source electrode 103 can comprises Au and Ti. The thickness of the Ti is about 2 nanometers, and the thickness of the Au is about 50 nanometers.

In step (S12), the functional dielectric layer 104 can be deposited on the first semiconductor carbon nanotube layer 101 via evaporating, sputtering, or printing. The functional dielectric layer 104 can cover entire the entire first semiconductor carbon nanotube layer 101 or only cover the portion of the first semiconductor carbon nanotube layer 101 that is between the first drain electrode 102 and the first source electrode 103. In one exemplary embodiment, the functional dielectric layer 104 is $Si_3N_4$ layer with a thickness of about 50 nanometers and formed via PECVD to cover all the first semiconductor carbon nanotube layer 101, the first drain electrode 102 and the first source electrode 103. Thus, the functional dielectric layer 104 can have high density without having positive charges. Then, the functional dielectric layer 104 can isolate the air and water, and dopes the first semiconductor carbon nanotube layer 101.

In step (S13), the first gate electrode 105 is formed on the functional dielectric layer 104 and insulated from the first semiconductor carbon nanotube layer 101. Furthermore, the length of the first gate electrode 105 can be smaller than the length of the channel between the first drain electrode 102 and the first source electrode 103. The first gate electrode 105 can be formed via evaporating, sputtering, or printing. In one exemplary embodiment, the first gate electrode 105 is formed on the functional dielectric layer 104 via evaporating a composite layer comprising Au and Ti. The material of the first gate electrode 105 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one exemplary embodiment, the material of the first gate electrode 105 can comprise Au and Ti. The thickness of the Ti is about 2 nanometers, and the thickness of the Au is about 50 nanometers.

In step (S14), the insulating layer 106 can be formed via evaporating, sputtering, or printing. In one exemplary embodiment, the insulating layer 106 is a $Al_2O_3$ layer with a thickness of about 30 nanometers and grown by ALD.

In step (S15), the second semiconductor carbon nanotube layer 107 can be formed by the method of making the first semiconductor carbon nanotube layer 101 in step (S10).

In step (S16), the through hole 110 can be performed by etching, such as dry etching or wet etching, the first insulating layer 106, and then lift-off after deposition electrode material. If the functional dielectric layer 104 covers the first drain electrode 102, part of the functional dielectric layer 104 need to be etched together with the first insulating layer 106. In one exemplary embodiment, both the functional dielectric layer 104 and the first insulating layer 106 are etched by wet etching.

In step (S17), the second drain electrode 108 and the second source electrode 109 can be formed by the method of making the first drain electrode 102 and the first source electrode 103 in step (S11).

Figure 3:
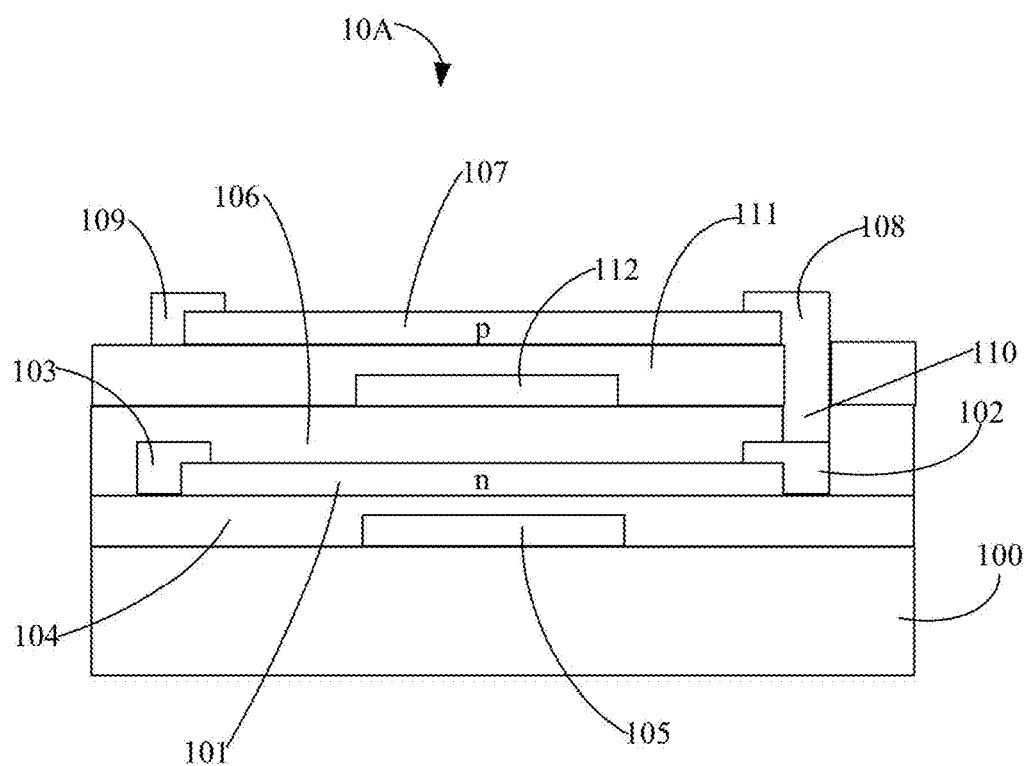
FIG. 3 shows a cross-section schematic view of another exemplary embodiment of the 3D CMOS CNT-TFT circuit in accordance to the present disclosure.

Referring to FIG. 3, another exemplary embodiment of a 3D CMOS CNT-TFT circuit 10A comprises an insulating substrate 100, a first semiconductor carbon nanotube layer 101, a first drain electrode 102, a first source electrode 103, a functional dielectric layer 104, a first gate electrode 105, a first insulating layer 106, a second semiconductor carbon nanotube layer 107, a second drain electrode 108, a second source electrode 109, a second insulating layer 111, and a second gate electrode 112.

The 3D CMOS CNT-TFT circuit 10A is similar to the 3D CMOS CNT-TFT circuit 10 above, except that the 3D CMOS CNT-TFT circuit 10A further comprises the second insulating layer 111 and the second gate electrode 112; and both the n-type TFT and the p-type TFT are back gate type TFT. In one exemplary embodiment, the first semiconductor carbon nanotube layer 101, the first drain electrode 102, the first source electrode 103, the functional dielectric layer 104, and the first gate electrode 105 form a back gate type n-type TFT. The second semiconductor carbon nanotube layer 107, the second drain electrode 108, the second source electrode 109, the second insulating layer 111 and the second gate electrode 112 form a back gate type p-type TFT. The n-type TFT and the p-type TFT are stacked on one another and are separated from each other by the first insulating layer 106. The first drain electrode 102 and the second drain electrode 108 are electrically connected with each other. The first gate electrode 105 and the second gate electrode 112 are also electrically connected with each other via a through hole and used as the input electrode.

Figure 4:
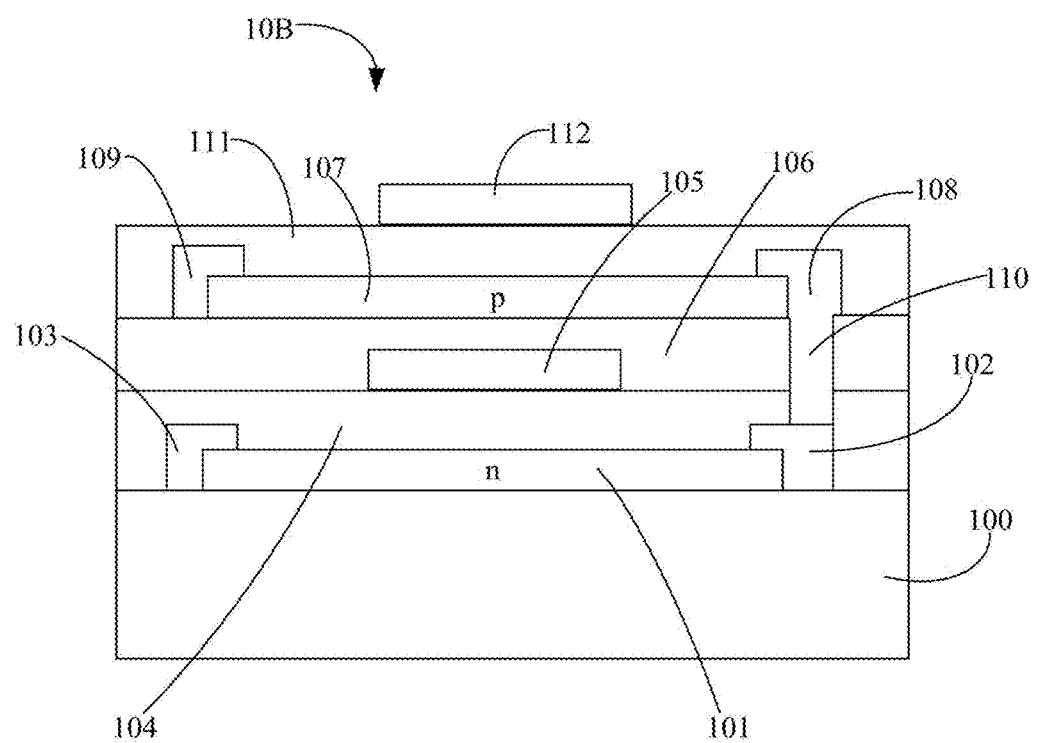
FIG. 4 shows a cross-section schematic view of another exemplary embodiment of a 3D CMOS CNT-TFT circuit in accordance to the present disclosure.

Referring to FIG. 4, another exemplary embodiment of a 3D CMOS CNT-TFT circuit 10B comprises an insulating substrate 100, a first semiconductor carbon nanotube layer 101, a first drain electrode 102, a first source electrode 103, a functional dielectric layer 104, a first gate electrode 105, a first insulating layer 106, a second semiconductor carbon nanotube layer 107, a second drain electrode 108, a second source electrode 109, a second insulating layer 111, and a second gate electrode 112.

The 3D CMOS CNT-TFT circuit 10B is similar to the 3D CMOS CNT-TFT circuit 10A above, except both the n-type TFT and the p-type TFT are top gate type TFT. In one exemplary embodiment, the first semiconductor carbon nanotube layer 101, the first drain electrode 102, the first source electrode 103, the functional dielectric layer 104, and the first gate electrode 105 form a top gate type n-type TFT. The second semiconductor carbon nanotube layer 107, the second drain electrode 108, the second source electrode 109, the second insulating layer 111 and the second gate electrode 112 form a top gate type p-type TFT. The n-type TFT and the p-type TFT are stacked on one another and separated from each other by the first insulating layer 106. The first drain electrode 102 and the second drain electrode 108 are electrically connected with each other. The first gate electrode 105 and the second gate electrode 112 are also electrically connected with each other via a through hole and used as the input electrode.

Figure 5:
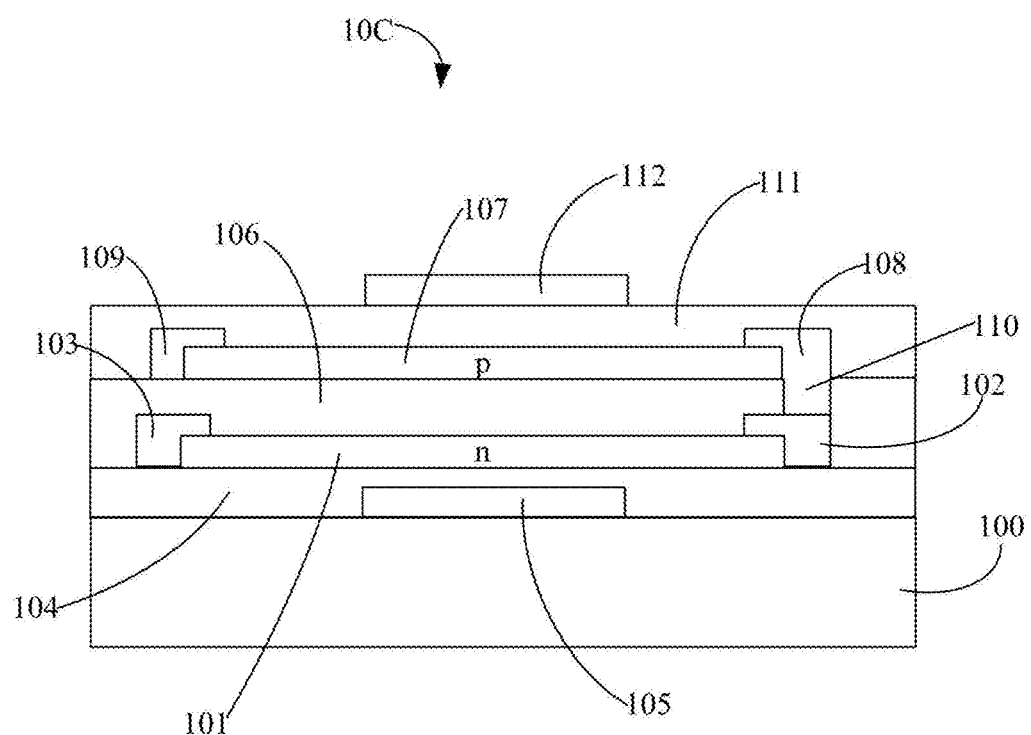
FIG. 5 shows a cross-section schematic view of another exemplary embodiment of a 3D CMOS CNT-TFT circuit in accordance to the present disclosure.

Referring to FIG. 5, another exemplary embodiment of a 3D CMOS CNT-TFT circuit 10C comprises an insulating substrate 100, a first semiconductor carbon nanotube layer 101, a first drain electrode 102, a first source electrode 103, a functional dielectric layer 104, a first gate electrode 105, a first insulating layer 106, a second semiconductor carbon nanotube layer 107, a second drain electrode 108, a second source electrode 109, a second insulating layer 111, and a second gate electrode 112.

The 3D CMOS CNT-TFT circuit 10C is similar to the 3D CMOS CNT-TFT circuit 10A above, except the p-type TFT is top gate type TFT. In one exemplary embodiment, the first semiconductor carbon nanotube layer 101, the first drain electrode 102, the first source electrode 103, the functional dielectric layer 104, and the first gate electrode 105 form a back gate type n-type TFT. The second semiconductor carbon nanotube layer 107, the second drain electrode 108, the second source electrode 109, the second insulating layer 111 and the second gate electrode 112 form a top gate type p-type TFT. The n-type TFT and the p-type TFT are stacked on one another and separated from each other by the first insulating layer 106. The first drain electrode 102 and the second drain electrode 108 are electrically connected with each other. The first gate electrode 105 and the second gate electrode 112 are also electrically connected with each other via a through hole and used as the input electrode.

The methods for making the 3D CMOS CNT-TFT circuits 10A, 10B, 10C are similar to the method for making the 3D CMOS CNT-TFT circuit 10 above, except that further comprising forming the second insulating layer 111, and a second gate electrode 112, and also the order of the steps are different according to the structure of the 3D CMOS CNT-TFT circuits 10A, 10B, 10C. The methods for making the 3D CMOS CNT-TFT circuits 10A, 10B, 10C are not limited as long as the n-type TFT and the p-type TFT are formed by stacking one on the other one.

EXAMPLE 1

Figure 6:
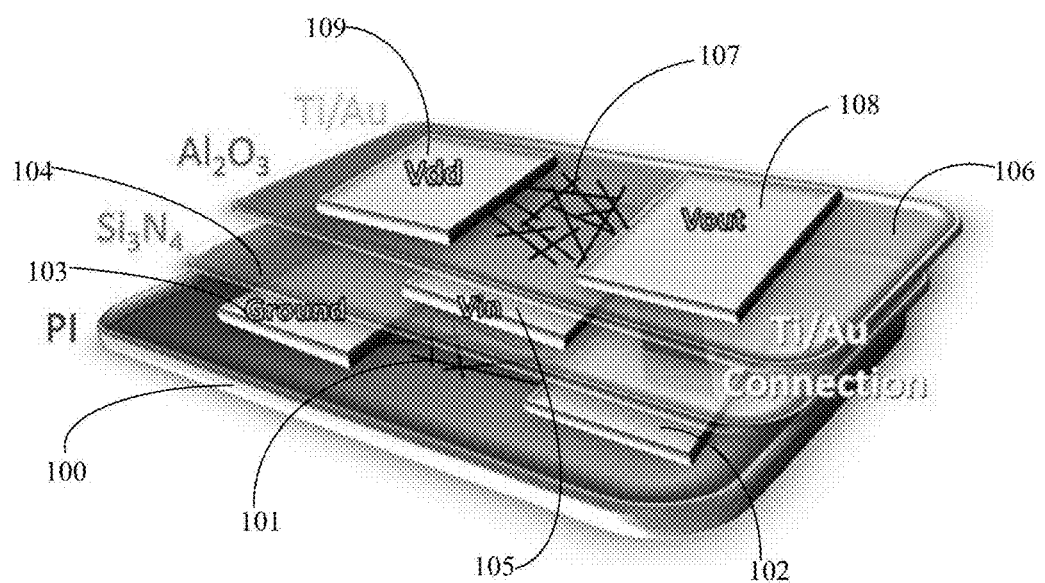
FIG. 6 shows a schematic structural view of a 3D CMOS CNT-TFT circuit of example 1.
Figure 7:
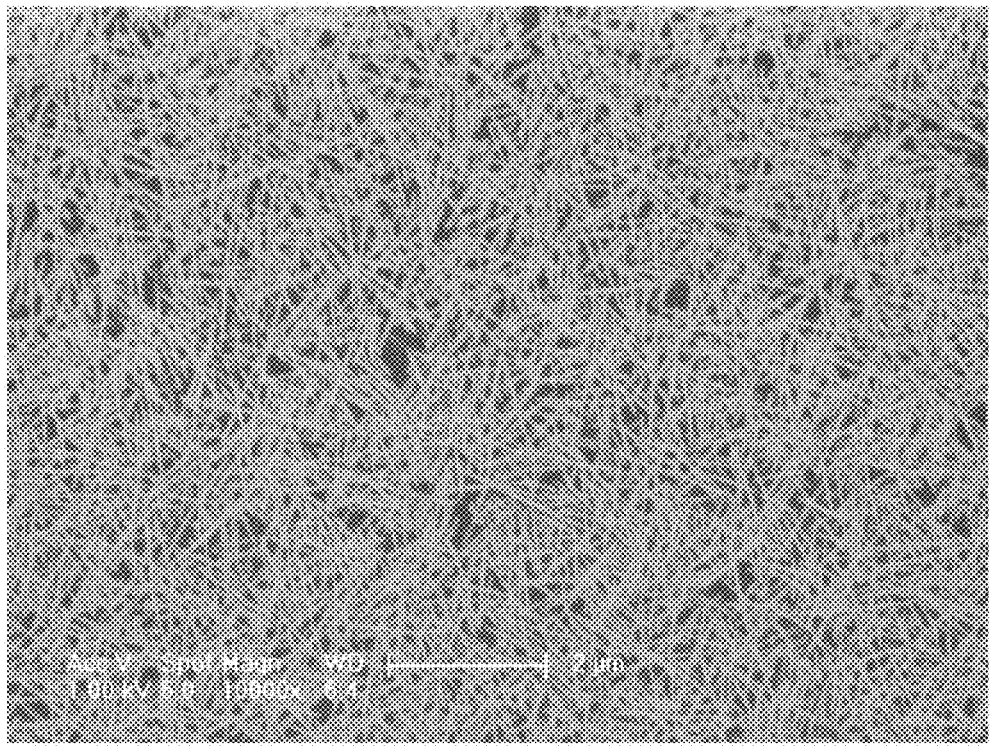
FIG. 7 shows a Scanning Electron Microscope (SEM) image of a first semiconductor carbon nanotube layer of the example 1.
Figure 8:
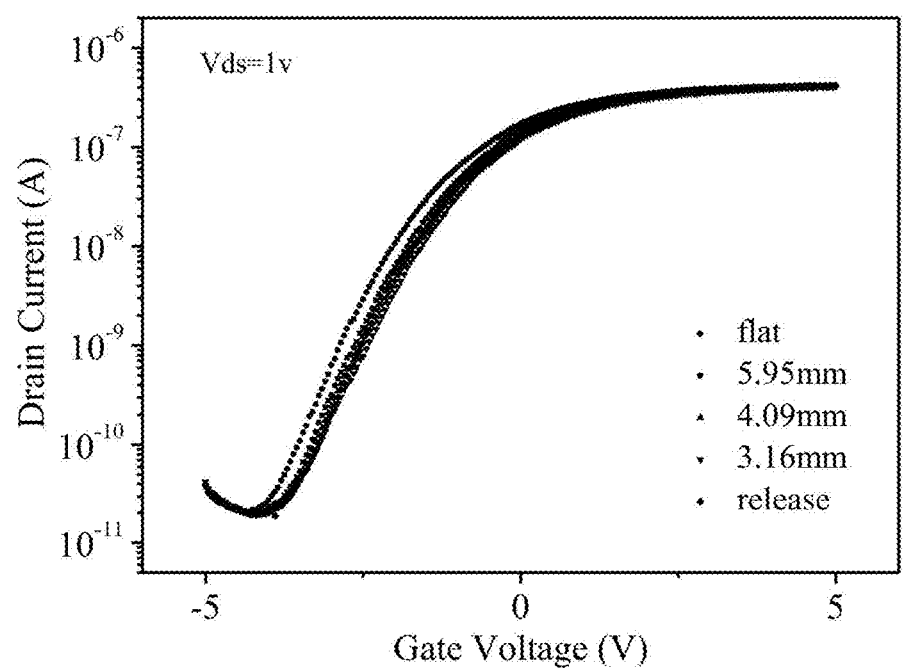
FIG. 8 shows transfer curves of the n-type TFTs of the example 1.

Referring to FIG. 6, a 3D CMOS CNT-TFT circuit is fabricated and used as a typical inverter. A PI substrate is used as the insulating substrate 100. To avoid the influence of water penetration through the backside of the PI substrate, a 30 nanometers thick $Al_2O_3$ layer was grown on the PI substrate through ALD at first. The $Al_2O_3$ layer is configured to smooth and fix the PI substrate as well as protecting the PI substrate from oxygen and water penetrating from the rear of the PI substrate and affect the performance of the n-type TFTs. Then, a uniform SWCNT network was fabricated on the PI substrate and patterned to form a plurality of first semiconductor carbon nanotube layer 101. FIG. 7 shows the SEM image of the first semiconductor carbon nanotube layer 101. A first Ti/Au film is applied to cover the plurality of first semiconductor carbon nanotube layer 101 by evaporating and then patterned to form a plurality of first electrodes. Every two of the plurality of first electrodes corresponds to one first semiconductor carbon nanotube layer 101 and is used as the first drain electrode 102 and the first source electrode 103. Then, 50 nanometers of $Si_3N_4$ thin film was grown through PECVD as the functional dielectric layer 104 to cover the entire PI substrate. The $Si_3N_4$ thin film is configured to convert the as fabricated p-type CNT-TFTs to n-type CNT-TFTs. The $Si_3N_4$ thin film deposition conditions were 70 sccm (standard state cubic centimeters per minute) nitrogen, 4 sccm silane at 300° C., and most importantly, it was necessary to purge the chamber with nitrogen gas continuously for 30 min at 300° C. before the deposition procedure started. This procedure ensured that no adsorption of water vapor and oxygen on carbon nanotubes of the first semiconductor carbon nanotube layer 101 occurred. Then a second Ti/Au film is applied to cover the $Si_3N_4$ thin film by evaporating and then patterned to form a plurality of first gates 105. Every the plurality of first gates 105 corresponds to one first semiconductor carbon nanotube layer 101. Thus, an n-type TFTs array is obtained on the flexible PI substrate. The electrical properties of the n-type TFTs array is tested at bending radii of 5.95 millimeters, 4.09 millimeters, and 3.16 millimeters. It is founded that the transfer curves had almost no change as shown in FIG. 8. Meanwhile, nearly zero TFT had electrical leakage, even at a bending radius of 3.16 the n-type TFTs. Thus, $Si_3N_4$ grown through PECVD is a reliable dielectric material for n-type flexible CNT-TFTs.

After the preparation of the n-type flexible CNT-TFTs, the p-type TFTs is integrated. When fabricating conventional n-type CNT-TFT devices, the conventional CMOS circuits based on both p-type and n-type CNT-TFTs all have either large sizes or large intervals. Thus, they can only meet the requirements of large devices and the integration of p-type and n-type TFTs is inefficient and unstable as device size decreases. In the present disclosure, the 3D structured CMOS circuit based on two-layer CNT-TFT devices can solve the problem of integrating CNT-TFT CMOS circuits. The p-type TFTs were fabricated on top of n-type top gate type TFTs.

Figure 9:
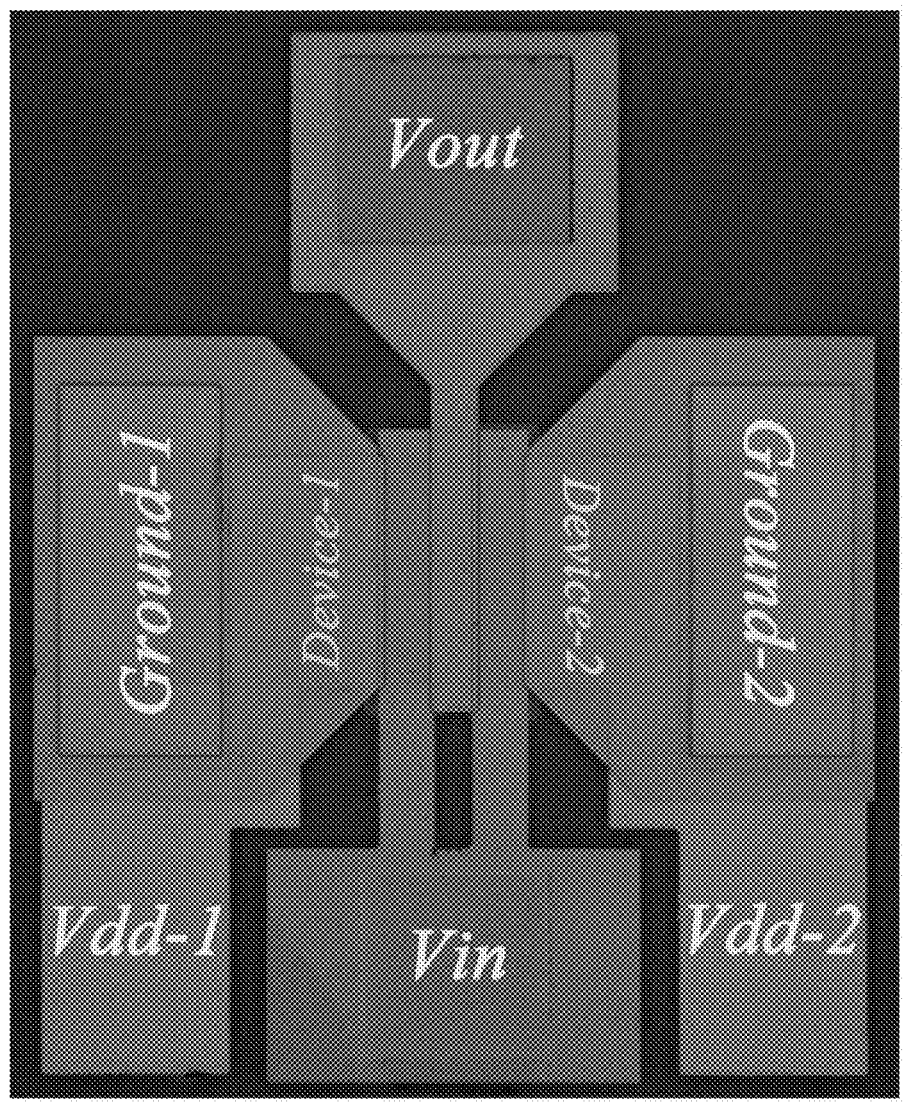
FIG. 9 shows an optical microscope photograph of two 3D flexible CMOS CNT-TFT inverters of the example 1.

After the preparation of the n-type flexible CNT-TFTs, a 30 nanometers thick $Al_2O_3$ thin film was fabricated using ALD to cover the plurality of first gates 105 and used as the first insulating layer 106 to separate the two-layer device. Then, a SWCNT thin film was applied on the $Al_2O_3$ thin film by transferring a ready-made SWCNT thin film and patterned to form a plurality of second semiconductor carbon nanotube layers 107. After that, through holes 110 were defined by photolithography and the $Al_2O_3$ insulating layer 106 was etched to ensure the first drain electrodes 102 exposed. Finally, a third Ti/Au film is applied to cover the plurality of second semiconductor carbon nanotube layers 107 by evaporating and then patterned to form a plurality of second electrodes. Every two of the plurality of second electrodes corresponds to one second semiconductor carbon nanotube layer 107 and used as the second drain electrode 108 and the second source electrode 109. The second drain electrode 108 is electrically connected to the corresponding first drain electrodes 102. As such, the 3D CMOS CNT-TFT circuits are fabricated and can be used as a typical inverter as shown in FIG. 9. The p-type TFT was built just above the n-type TFT, using the local top gate of the n-type TFT device as the back gate of the p-type TFT device. The first drain electrodes 102 and the second drain electrode 108 are electrically connected to each other and used as the $V_{out}$ electrode.

Figure 10:
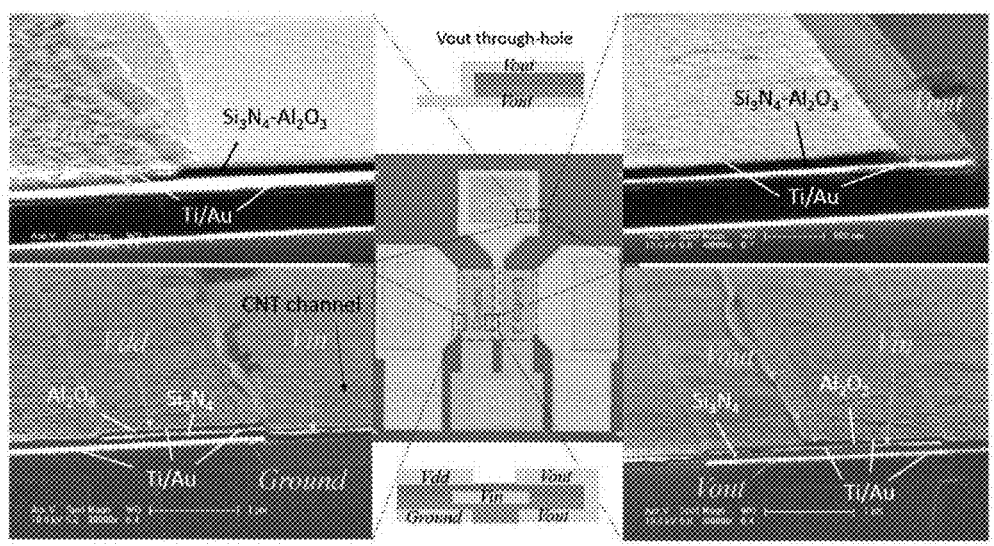
FIG. 10 shows cross-sectional SEM images of different portions of the 3D CMOS CNT-TFT inverters of FIG. 9.

To observe the 3D CMOS CNT-TFT circuit directly, the 3D CMOS CNT-TFT circuit inverters of FIG. 9 was cut across its conductive channel. FIG. 10 shows cross-sectional SEM images of different portions of the 3D CMOS CNT-TFT circuit inverters FIG. 9. It can be seen that the upper source drain electrodes (the second source electrode 109 and the second drain electrode 108) and lower source drain electrodes (the first source electrodes 103 and the first drain electrodes 102) and middle gate electrode (the first gate 105) are separated by two layers (the functional dielectric layer 104 and the first insulating layer 106).

Figure 11:
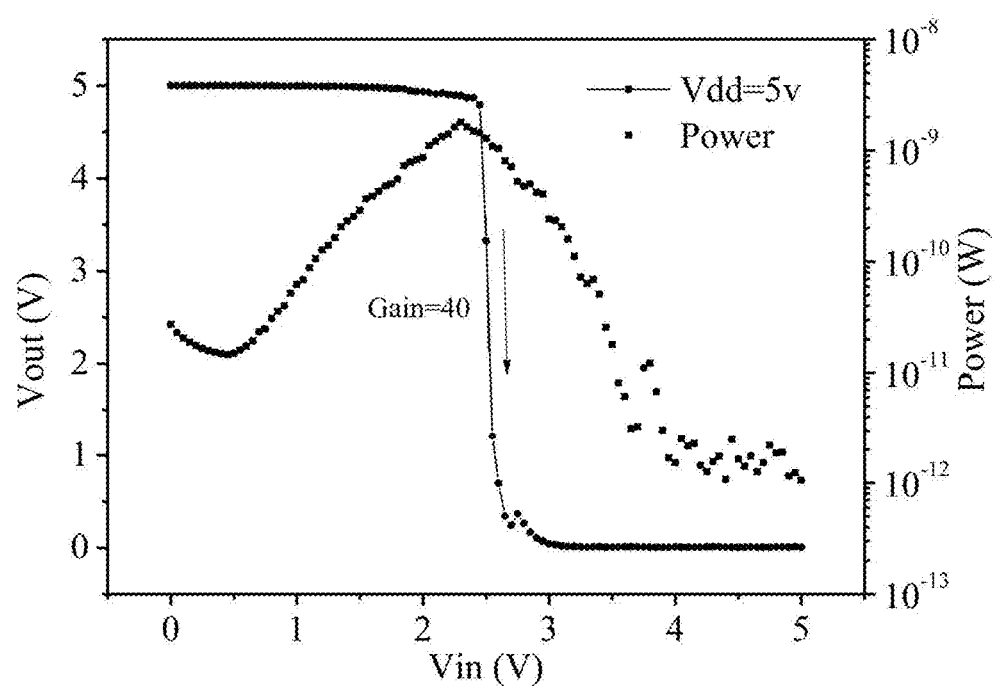
FIG. 11 shows a voltage transfer characteristics (VTC) and a power consumption curve of the 3D CMOS CNT-TFT circuit of the example 1.
Figure 12:
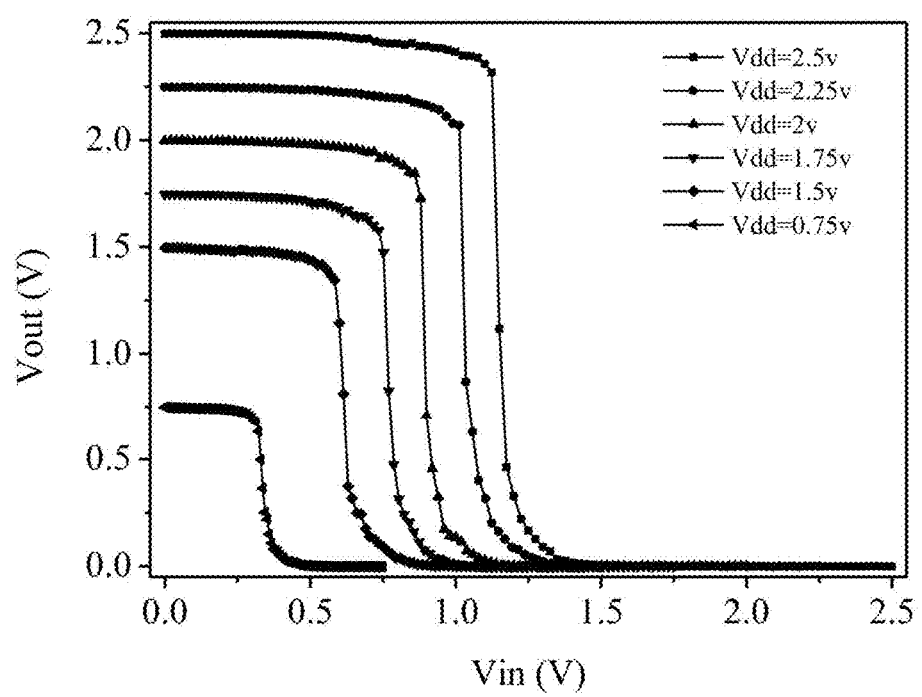
FIG. 12 shows an inverter VTC under various supply of the 3D CMOS CNT-TFT circuit of the example 1.
Figure 13:
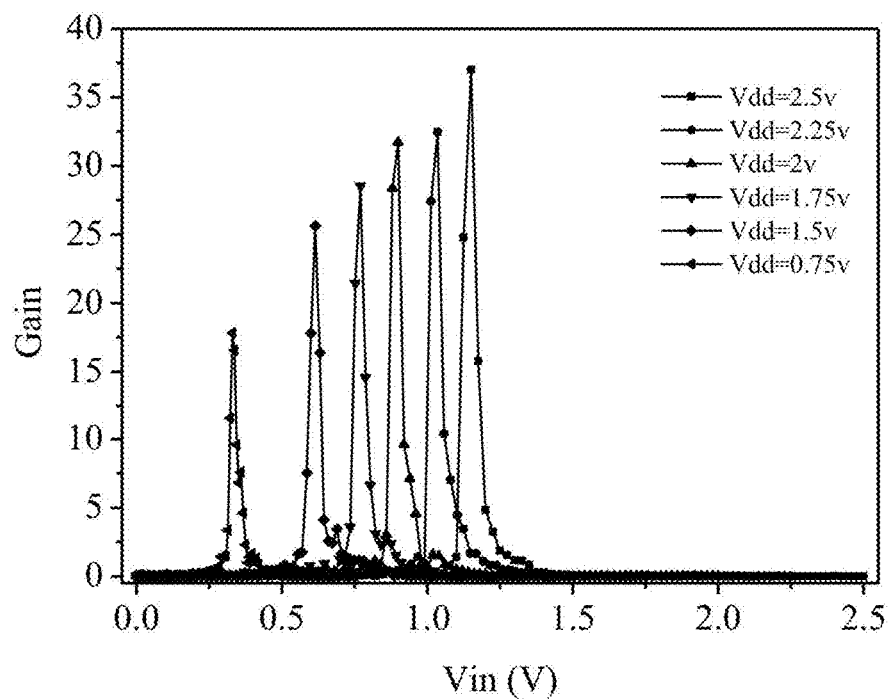
FIG. 13 shows a gain under various supply of the 3D CMOS CNT-TFT circuit of the example 1.

Experimental results also demonstrate that the 3D flexible CNT-TFT CMOS inverter has excellent electrical and mechanical properties. CMOS inverters preferably have high gain, large noise margin (NM), low static power consumption, and exactly matched input and output voltage. The voltage transfer characteristics (VTC) and power consumption curve ($P=V_{dd} \cdot I_{GND}$) of a typical 3D CMOS inverter are shown in FIG. 11. When input voltage is varied from 0 to 5 V, the output voltage changed exactly from 5 to 0 V, which ensures the devices can be cascaded. The inverter gain is near 40, and the switching threshold is near 2.5 V, half of the "high" output voltage (5 V). Therefore, the 3D CMOS inverter has an extremely outstanding noise margin. Static power consumption is as low as a nanowatt, even working at the switching threshold voltage. Experimental results also show that 3D flexible CMOS inverters can work well in a wide voltage range, from 0.75 to 5 V or more. FIGS. 12-13 show the inverter VTC and gain under various supply voltages ($V_{dd}$=0.75, 1.5, 1.75, 2, 2.25, and 2.5 V). The results shows that the switching thresholds at various supply voltages are all close to half of the supply voltages, demonstrating that the inverter works in a symmetric operating voltage window, ensuring large noise margin and keeping the inverter gain at a high level, larger than 18, even when the supply voltage is reduced to 0.75 V. Meanwhile, the inverter gain shows a linear relationship with supply voltage as $V_{dd}$ decreases to the threshold voltage and the device's transconductance increases as $V_{dd}$ grows, so the inverter gain increases as well.

Figure 14:
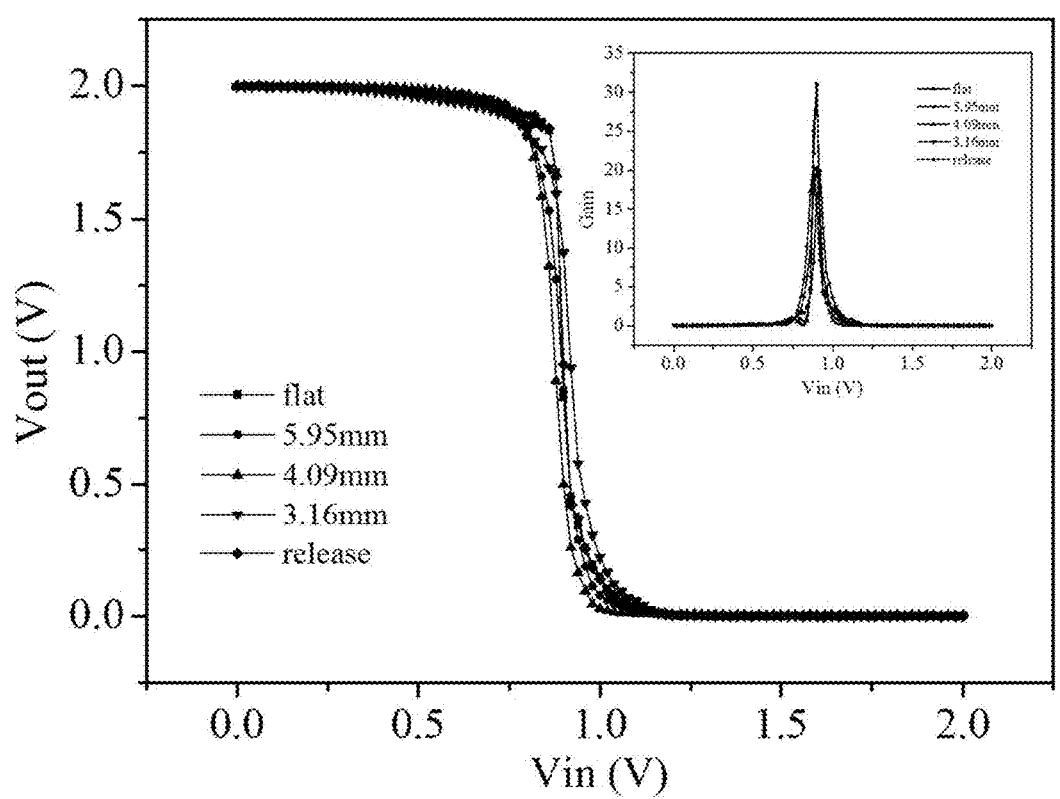
FIG. 14 shows a voltage transfer curve and gain, working at $V_{dd}$ of 2.0, of the 3D CMOS CNT-TFT circuit with various bending radii of the example 1.
Figure 15:
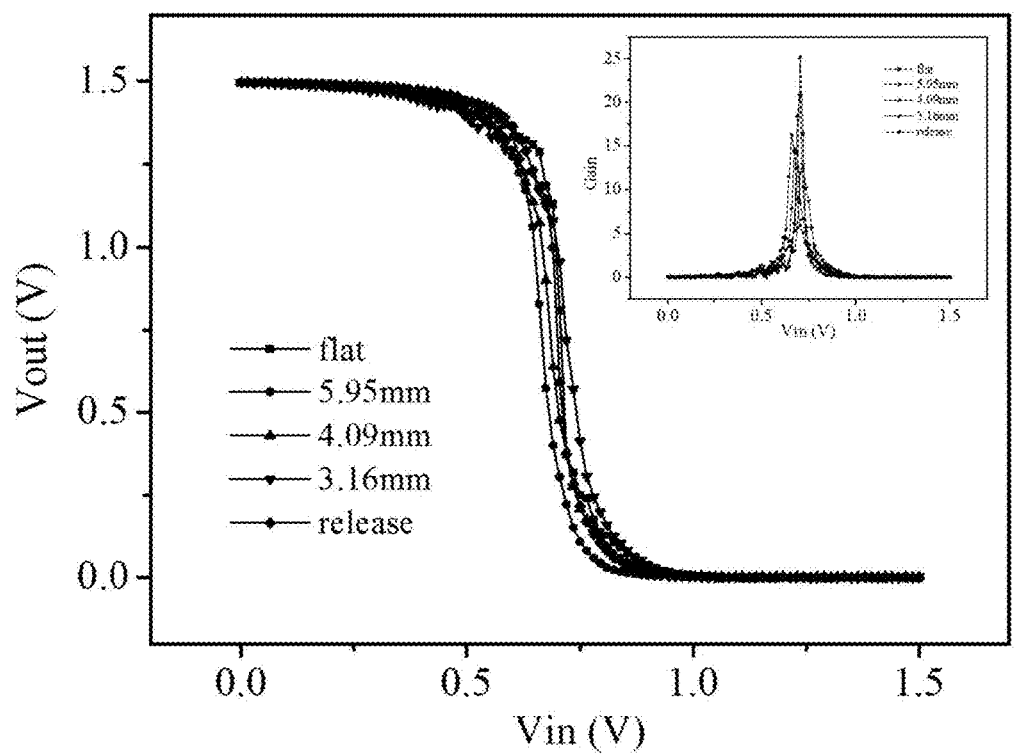
FIG. 15 shows a voltage transfer curve and gain, working at $V_{dd}$ of 1.5V, of the 3D CMOS CNT-TFT circuit with various bending radii of the example 1.

The flexibility of the 3D CMOS inverters on the PI substrate is evaluated by bending the devices at different radii and determining their electrical performances. The bending radii were 5.95 millimeters, 4.09 millimeters and 3.16 millimeters, which were smaller than the minimum bending radius of human hands. Flexible and wearable test results of the 3D flexible CMOS inverter voltage transfer curve and gain with various bending radii, working at $V_{dd}$ of 2.0V and 1.5V are shown in FIGS. 14-15. The inverter could still work at various supply voltages, and although its gain changed a little and its switching threshold swung slightly, it still showed high performance with respect to gain and noise margin, having almost no influence for practical application. This was consistent with the slight threshold voltage change when bending the n-type TFTs. To verify the 3D flexible CMOS circuits' resistance to bending fatigue, the electrical performance of the n-type CNT-TFTs and inverters after various bending cycles of over 1000 times with the bending radius of less than 4 millimeters is tested. The devices could endure multiple high bending strength and keep at a high level of electrical performance. On the other hand, because the PI substrate is extremely thin, it can closely fit on various surfaces easily. With the logic stability of the 3D CMOS inverters fabricated on it, it is applicable for flexible and wearable electronic device applications.

Figure 16:
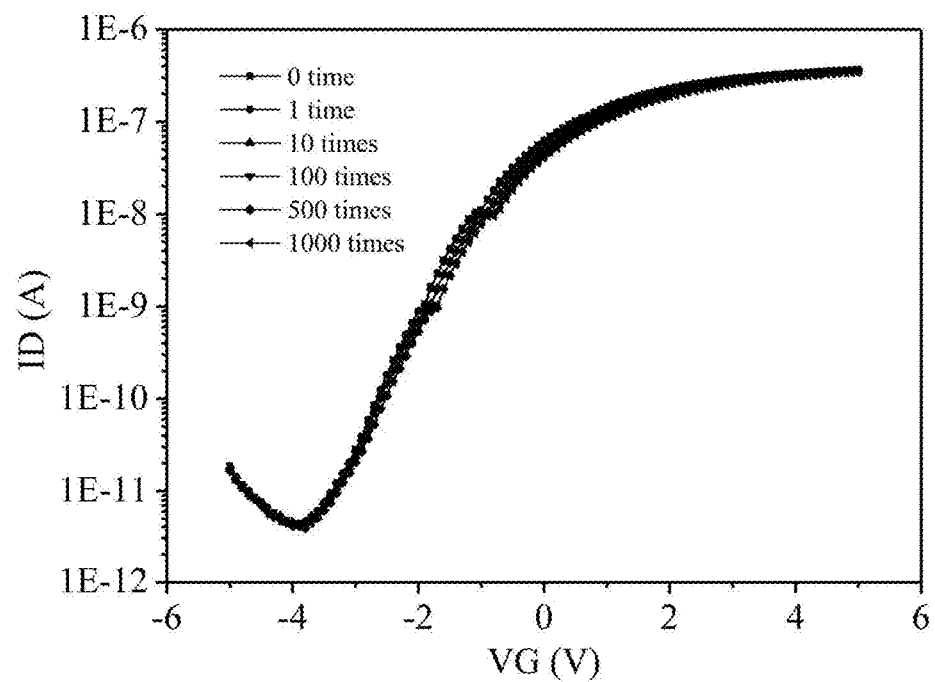
FIG. 16 shows a change of the electrical performance after various bending cycles of the typical n-type CNT-TFT array of the example 1.
Figure 17:
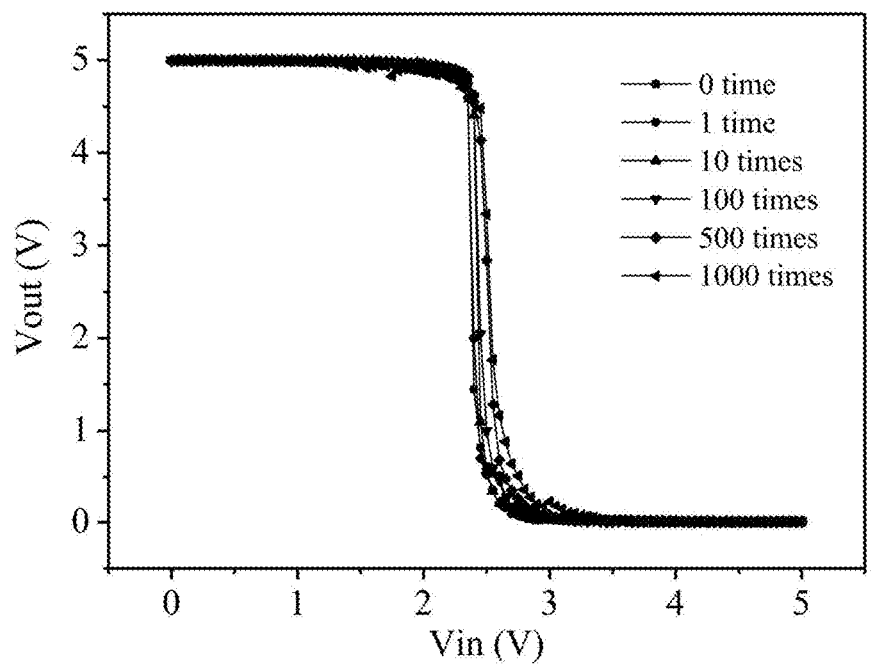
FIG. 17 shows a change of the electrical performance after various bending cycles of the CMOS inverter of the example 1.
Figure 18:
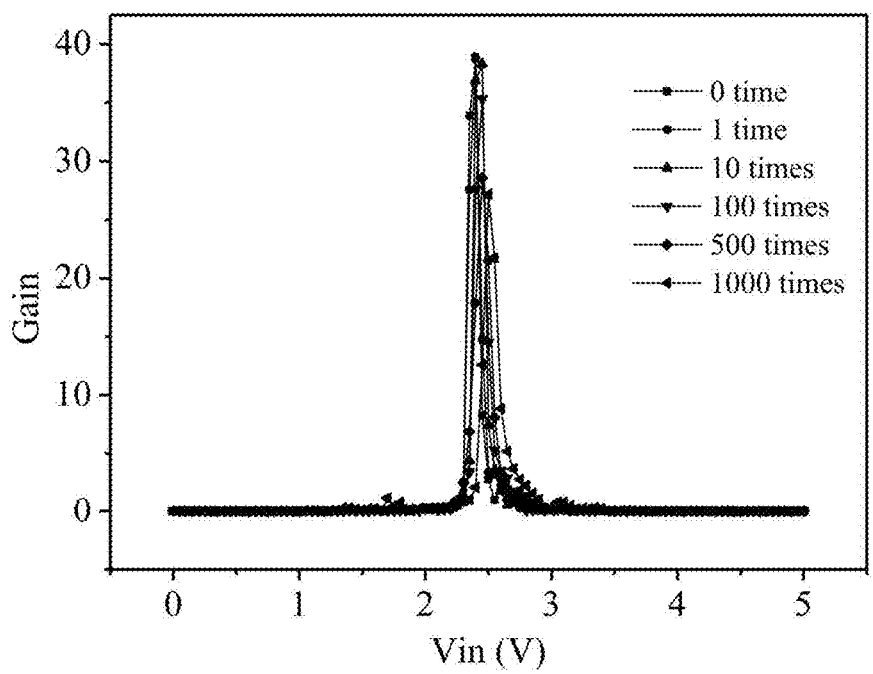
FIG. 18 shows the inverter gain after various bending cycles of the CMOS inverter of the example 1.

To verify the 3D flexible CMOS circuits' resistance to bending fatigue, the electrical performance of the n-type CNT-TFTs and inverters after various bending cycles are tested and shown in FIGS. 16-18. From FIG. 16, it can be seen that the on and off current of n-type CNT-TFT had almost no change after over 1000 times bending cycles with bending radius less than 4 millimeters. The only tiny change is threshold voltage moving towards positive voltage slightly. As a result, the switching threshold and gain of CMOS inverter change a little after bending, but can hardly influence its performance, which still keeps $V_{out}$ and Gain in a high level as shown in FIGS. 17-18. FIG. 18 also shows that the CMOS inverter still works with high performance presenting high gain, accurate switching threshold at the half of $V_{dd}$ and large noise margin. Thus, the 3D CMOS circuits are proved to be suitable for flexible application further more.

Depending on the exemplary embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present exemplary embodiments have been set forth in the foregoing description, together with details of the structures and functions of the exemplary embodiments, the disclosure is illustrative only, and changes may be made in detail, especially in matters of shape, size, and arrangement of parts within the principles of the disclosure.

What is claimed is:

1. A metal oxide semiconductor carbon nanotube thin film transistor circuit comprising:
    an insulating substrate;
    a first semiconductor carbon nanotube layer on the insulating substrate, wherein the first semiconductor carbon nanotube layer is an n-type semiconductor layer;
    a first drain electrode and a first source electrode, wherein the first drain electrode and the first source electrode are electrically connected to and separated by the first semiconductor carbon nanotube layer;
    a functional dielectric layer on and covering the first semiconductor carbon nanotube layer, the first drain electrode, and the first source electrode;
    a first gate electrode on the functional dielectric layer and insulated from the first semiconductor carbon nanotube layer, the first source electrode, and the first drain electrode;
    a first insulating layer on and covering the first gate electrode and the functional dielectric layer;
    a second semiconductor carbon nanotube layer on the first insulating layer, wherein the second semiconductor carbon nanotube layer is a p-type semiconductor carbon nanotube layer;
    a second drain electrode and a second source electrode on the first insulating layer, wherein the second drain electrode and the second source electrode are electrically connected to and separated by the second semiconductor carbon nanotube layer, and the first drain electrode and the second drain electrode are electrically connected with each other; wherein a through hole is defined by the functional dielectric layer and the first insulating layer to expose the first drain electrode, and the second drain electrode extends through the through hole to be in direct contact with the first drain electrode;
    a second insulating layer on the first insulating layer and covering the second semiconductor carbon nanotube layer; and
    a second gate on the second insulating layer and separated from the second semiconductor carbon nanotube layer.

2. The metal oxide semiconductor carbon nanotube thin film transistor circuit of claim 1, wherein the insulating substrate comprises a polymer film.

3. The metal oxide semiconductor carbon nanotube thin film transistor circuit of claim 1, wherein each of the first semiconductor carbon nanotube layer and the second semiconductor carbon nanotube layer comprises a plurality of single-walled carbon nanotubes connected with each other to form a conductive network.

4. The metal oxide semiconductor carbon nanotube thin film transistor circuit of claim 1, wherein the functional dielectric layer comprises materials selected from the group consisting of hafnium oxide, yttrium oxide, silicon nitride, magnesium oxide, potassium, and organic polymers.

5. The metal oxide semiconductor carbon nanotube thin film transistor circuit of claim 1, wherein the functional dielectric layer comprises a magnesium oxide layer and an aluminum oxide layer.

6. The metal oxide semiconductor carbon nanotube thin film transistor circuit of claim 1, wherein the functional dielectric layer comprises a silicon nitride layer and the insulating layer comprises an aluminum oxide layer.

7. The metal oxide semiconductor carbon nanotube thin film transistor circuit of claim 1, wherein the second insulating layer covers the second semiconductor carbon nanotube layer, the second source electrode, and the second drain electrode.

8. A metal oxide semiconductor carbon nanotube thin film transistor circuit comprising:
    an insulating substrate;
    a first gate electrode on the insulating substrate;

a functional dielectric layer on the insulating substrate and covering the first gate;
a first semiconductor carbon nanotube layer on the functional dielectric layer, wherein the first semiconductor carbon nanotube layer is an n-type semiconductor carbon nanotube layer;
a first drain electrode and a first source electrode, wherein the first drain electrode and the first source electrode are on the functional dielectric layer, electrically connected to and separated from each other by the first semiconductor carbon nanotube layer;
a first insulating layer on the functional dielectric layer and covering the first drain electrode, the first source electrode and the first semiconductor carbon nanotube layer;
a second gate on the first insulating layer and separated from each other from the first semiconductor carbon nanotube layer
a second insulating layer on the first insulating layer and covering the second gate;
a second semiconductor carbon nanotube layer on the second insulating layer, wherein the second semiconductor carbon nanotube layer is a p-type semiconductor carbon nanotube layer; and
a second drain electrode and a second source electrode on the second insulating layer, wherein the second drain electrode and the second source electrode are electrically connected to and separated from each other by the second semiconductor carbon nanotube layer, and the first drain electrode and the second drain electrode are electrically connected with each other.

9. The metal oxide semiconductor carbon nanotube thin film transistor circuit of claim 8, wherein the insulating substrate comprises a polymer film.

10. The metal oxide semiconductor carbon nanotube thin film transistor circuit of claim 8, wherein every of the first semiconductor carbon nanotube layer and the second semiconductor carbon nanotube layer comprises a plurality of single-walled carbon nanotubes connected with each other to form a conductive network.

11. The metal oxide semiconductor carbon nanotube thin film transistor circuit of claim 8, wherein the functional dielectric layer comprises material selected from the group consisting of hafnium oxide, yttrium oxide, silicon nitride, magnesium oxide, potassium, and organic polymers.

12. The metal oxide semiconductor carbon nanotube thin film transistor circuit of claim 8, wherein the functional dielectric layer comprises a magnesium oxide layer and an aluminum oxide layer.

13. The metal oxide semiconductor carbon nanotube thin film transistor circuit of claim 8, wherein the functional dielectric layer comprises a silicon nitride layer and the insulating layer comprises an aluminum oxide layer.

14. The metal oxide semiconductor carbon nanotube thin film transistor circuit of claim 8, wherein a through hole is defined by the first insulating layer and the second insulating layer to expose the first drain electrode; and the second drain electrode extends through the through hole to be in direct contact with the first drain electrode.

15. The metal oxide semiconductor carbon nanotube thin film transistor circuit of claim 1, wherein a portion of the second semiconductor carbon nanotube layer, between the second drain electrode and the second source electrode, is exposed and not covered.

16. A metal oxide semiconductor carbon nanotube thin film transistor circuit comprising:
an insulating substrate;
a first gate electrode on the insulating substrate;
a functional dielectric layer on the insulating substrate and covering the first gate;
a first semiconductor carbon nanotube layer on the functional dielectric layer, wherein the first semiconductor carbon nanotube layer is an n-type semiconductor carbon nanotube layer;
a first drain electrode and a first source electrode, wherein the first drain electrode and the first source electrode are on the functional dielectric layer, electrically connected to, and separated from each other by the first semiconductor carbon nanotube layer;
a first insulating layer on the functional dielectric layer and covering the first drain electrode, the first source electrode and the first semiconductor carbon nanotube layer;
a second semiconductor carbon nanotube layer on the first insulating layer, wherein the second semiconductor carbon nanotube layer is a p-type semiconductor carbon nanotube layer; and
a second drain electrode and a second source electrode on the first insulating layer, wherein the second drain electrode and the second source electrode are electrically connected to and separated from each other by the second semiconductor carbon nanotube layer, and the first drain electrode and the second drain electrode are electrically connected with each other;
a second insulating layer on the first insulating layer and covering the second semiconductor carbon nanotube layer; and
a second gate on the second insulating layer and separated from the second semiconductor carbon nanotube layer.

17. The metal oxide semiconductor carbon nanotube thin film transistor circuit of claim 16, wherein the insulating substrate comprises a polymer film.

18. The metal oxide semiconductor carbon nanotube thin film transistor circuit of claim 16, wherein every of the first semiconductor carbon nanotube layer and the second semiconductor carbon nanotube layer comprises a plurality of single-walled carbon nanotubes connected with each other to form a conductive network.

19. The metal oxide semiconductor carbon nanotube thin film transistor circuit of claim 16, wherein the functional dielectric layer comprises material selected from the group consisting of hafnium oxide, yttrium oxide, silicon nitride, magnesium oxide, potassium, and organic polymers.

* * * * *